(12) United States Patent
Yen et al.

(10) Patent No.: US 12,027,364 B2
(45) Date of Patent: Jul. 2, 2024

(54) METHOD FOR MANUFACTURING SEMICONDUCTOR DEVICE USING PLASMA-ENHANCED ATOMIC LAYER DEPOSITION

(71) Applicant: TAIWAN CARBON NANO TECHNOLOGY CORPORATION, Miaoli County (TW)

(72) Inventors: Tsung-Fu Yen, Miaoli County (TW); Kuang-Jui Chang, Miaoli County (TW); Chun-Hsien Tsai, Miaoli County (TW); Ting-Chuan Lee, Miaoli County (TW); Chun-Jung Tsai, Miaoli County (TW)

(73) Assignee: TAIWAN CARBON NANO TECHNOLOGY CORPORATION, Miaoli County (TW)

( * ) Notice: Subject to any disclaimer, the term of this patent is extended or adjusted under 35 U.S.C. 154(b) by 413 days.

(21) Appl. No.: 17/513,390

(22) Filed: Oct. 28, 2021

(65) Prior Publication Data
US 2022/0139694 A1   May 5, 2022

(30) Foreign Application Priority Data
Oct. 30, 2020  (TW) ................................ 109137880

(51) Int. Cl.
*H01L 21/02* (2006.01)
*H01J 37/32* (2006.01)

(52) U.S. Cl.
CPC .... *H01L 21/0228* (2013.01); *H01J 37/32082* (2013.01); *H01J 37/32568* (2013.01); *H01L 21/02274* (2013.01); *H01L 21/02532* (2013.01); *H01L 21/0262* (2013.01); *H01J 2237/20214* (2013.01); *H01J 2237/3323* (2013.01)

(58) Field of Classification Search
CPC .......... H01L 21/0228; H01L 21/02274; H01L 21/02532; H01L 21/0262
See application file for complete search history.

(56) References Cited

U.S. PATENT DOCUMENTS

| | | | |
|---|---|---|---|
| 9,455,261 B1 * | 9/2016 | Sun ........................ | H10B 43/27 |
| 2019/0385820 A1 * | 12/2019 | Singhal ............. | H01J 37/32091 |
| 2020/0027726 A1 * | 1/2020 | Venkatasubramanian ................... | H01L 21/02274 |

\* cited by examiner

*Primary Examiner* — Walter H Swanson
(74) *Attorney, Agent, or Firm* — Muncy, Geissler, Olds & Lowe, P.C.

(57) ABSTRACT

A method for fabricating a semiconductor device by using a plasma-enhanced atomic layer deposition apparatus. A substrate comprising a silicon substrate and a first oxide layer is provided. A plurality of stacked structures are deposited on the substrate, which comprises a dielectric layer and a conductive layer. The stacked structures are etched to form trenches. A second oxide layer is deposited by using a plasma-enhanced atomic layer deposition apparatus that includes a chamber, an upper electrode, a lower electrode, and a three-dimensional rotation device. The upper electrode is connected to a first radio-frequency power device. The upper electrode is configured to generate a plasma. The lower electrode is connected to a second radio-frequency power device. The three-dimensional rotation device drives the substrate to rotate. A high resistance layer is deposited on the second oxide layer. A low resistance layer is deposited on the high resistance layer.

12 Claims, 7 Drawing Sheets

METHOD FOR MANUFACTURING SEMICONDUCTOR DEVICE USING PLASMA-ENHANCED ATOMIC LAYER DEPOSITION

FIELD OF THE INVENTION

The present disclosure relates to a method for manufacturing semiconductor device, and in particular to a method for manufacturing a semiconductor device using plasma-enhanced atomic layer deposition.

BACKGROUND OF THE INVENTION

The semiconductor industry is constantly booming Technological advances in semiconductor design and materials have resulted in smaller and more complex circuits for semiconductor devices. The functional density of semiconductor devices is generally increased and the size is reduced, which can increase production efficiency and reduce costs.

The functionality of semiconductor devices is limited by the area of the semiconductor wafer, and as semiconductor technology advances, more and more devices employ three-dimensional stacking techniques to increase the density of components. However, three-dimensional stacking techniques increase the complexity of semiconductor device processing and make it more difficult to maintain the process quality and stability of semiconductor devices and affect yield. Semiconductor wafers for three-dimensional integrated circuits have high structural and process requirements. Existing three-dimensional semiconductor processes still have a number of problems that affect the electrical and mechanical properties of semiconductor wafers. Therefore, a corresponding development in the fabrication of semiconductor devices to improve the quality and stability of the fabrication process is urgently needed.

SUMMARY OF THE INVENTION

The present disclosure provides a method for fabricating a semiconductor device using a plasma-enhanced atomic layer deposition that can substantially improve the uniformity of the deposited film.

The present disclosure also provides a plasma-enhanced atomic layer deposition apparatus that can substantially improve the uniformity of the deposited film.

A method for fabricating a semiconductor device by a plasma-enhanced atomic layer deposition of the present disclosure comprises the following steps. A substrate comprising a silicon substrate and a first oxide layer on the silicon substrate is provided. A plurality of stacked structures are deposited on the substrate, wherein each of the stacked structures comprises a dielectric layer and a conductive layer. The stacked structures are etched through a patterned photoresist layer to form at least one trench in the stacked structures, wherein the first oxide layer is exposed at a bottom of the at least one trench. A second oxide layer is deposited on the stacked structures and the at least one trench by a plasma-enhanced atomic layer deposition (PEALD) apparatus, wherein the plasma-enhanced atomic layer deposition apparatus comprises a chamber, an upper electrode is arranged at a top of the chamber and connected to a first radio-frequency power device for generating a plasma, a lower electrode, and a three-dimensional rotation device arranged below the chamber, the lower electrode arranged on the three-dimensional rotation device and connected to a second radio-frequency power device, the substrate is arranged on the lower electrode to perform a deposition process, and the three-dimensional rotation device drives the substrate to rotate so as to uniformly deposit the second oxide layer in the deposition process. A high resistance layer is deposited on the second oxide layer by the plasma-enhanced atomic layer deposition apparatus. A low resistance layer is deposited on the high resistance layer by the plasma-enhanced atomic layer deposition apparatus.

In an embodiment, a plasma-enhanced atomic layer deposition apparatus of the present disclosure comprises a chamber, an upper electrode, a lower electrode, and a three-dimensional rotation device. The upper electrode is arranged at a top of the chamber and connected to a first radio-frequency power device for generating a plasma, the three-dimensional rotation device is arranged below the chamber, and the lower electrode is arranged on the three-dimensional rotation device and connected to a second radio-frequency power device. A substrate is arranged on the lower electrode to perform a deposition process, the substrate comprises a silicon substrate and a first oxide layer, the first oxide layer is positioned on the silicon substrate, a plurality of stacked structures are deposited on the substrate, each of the stacked structures comprises a dielectric layer and a conductive layer, the stacked structures are etched through a patterned photoresist layer to form at least one trench in the stacked structures, and the first oxide layer is exposed at a bottom of the at least one trench. A second oxide layer is deposited on the stacked structures and the at least one trench, wherein the second oxide layer is deposited by a plasma-enhanced atomic layer deposition apparatus, the three-dimensional rotation device drives the substrate to rotate so as to uniformly deposit the second oxide layer in the deposition process, a high resistance layer is deposited on the second oxide layer by the plasma-enhanced atomic layer deposition apparatus, and a low resistance layer is deposited on the high resistance layer by the plasma-enhanced atomic layer deposition apparatus.

In view of the above-mentioned content, the present disclosure provides a plasma-enhanced atomic layer deposition apparatus and a for manufacturing method thereof, which can significantly improve the quality and stability of a semiconductor device by providing a plurality of stacked structures, a second oxide layer, a high resistance layer, and a low resistance layer. Through the three-dimensional rotation device, the plasma-enhanced atomic layer deposition apparatus can greatly improve the uniformity of the deposited film.

DETAILED DESCRIPTION OF THE PREFERRED EMBODIMENTS

Directional terms mentioned in the following embodiments, for example: up, down, left, right, front, or back, etc.

refer only to the directions of the attached drawings. Therefore, directional terms are used to describe and not to limit the disclosure. As used herein, the terms "about", "approximately", and "substantially" typically mean within +/−20% of a given value, more typically within +/−10% of a given value, more typically within +/−5% of a given value, more typically within 3% of a given value, more typically within +/−2% of a given value, more typically within +/−1% of a given value, and even more typically within +/−0.5% of a given value. The numerical values given in this disclosure are approximate numerical values, i. e. the values given can still have the meaning of "about" or "substantially" without being specifically stated with the terms "about" or "substantially".

Figure 3:
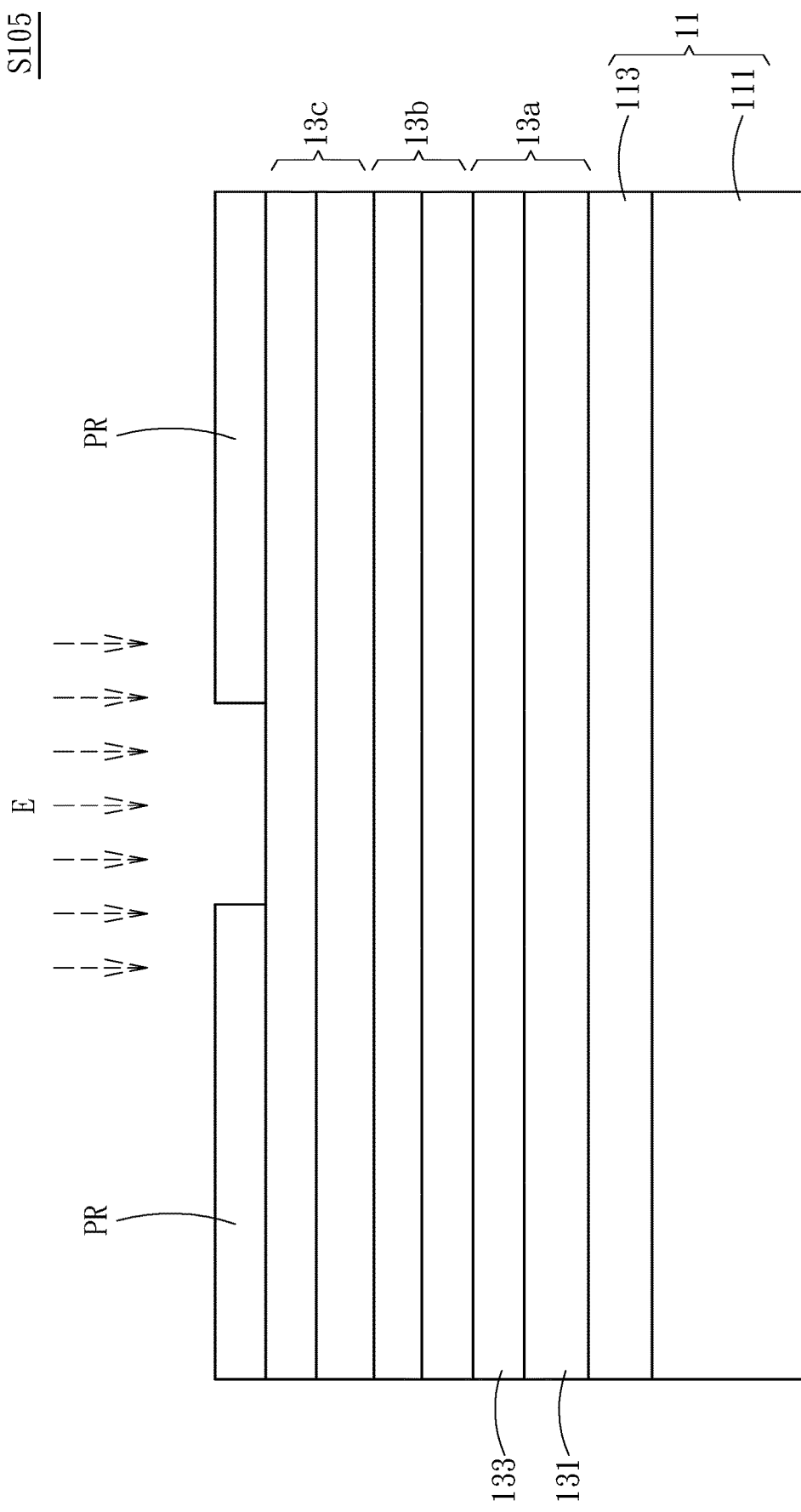
Figure 4:
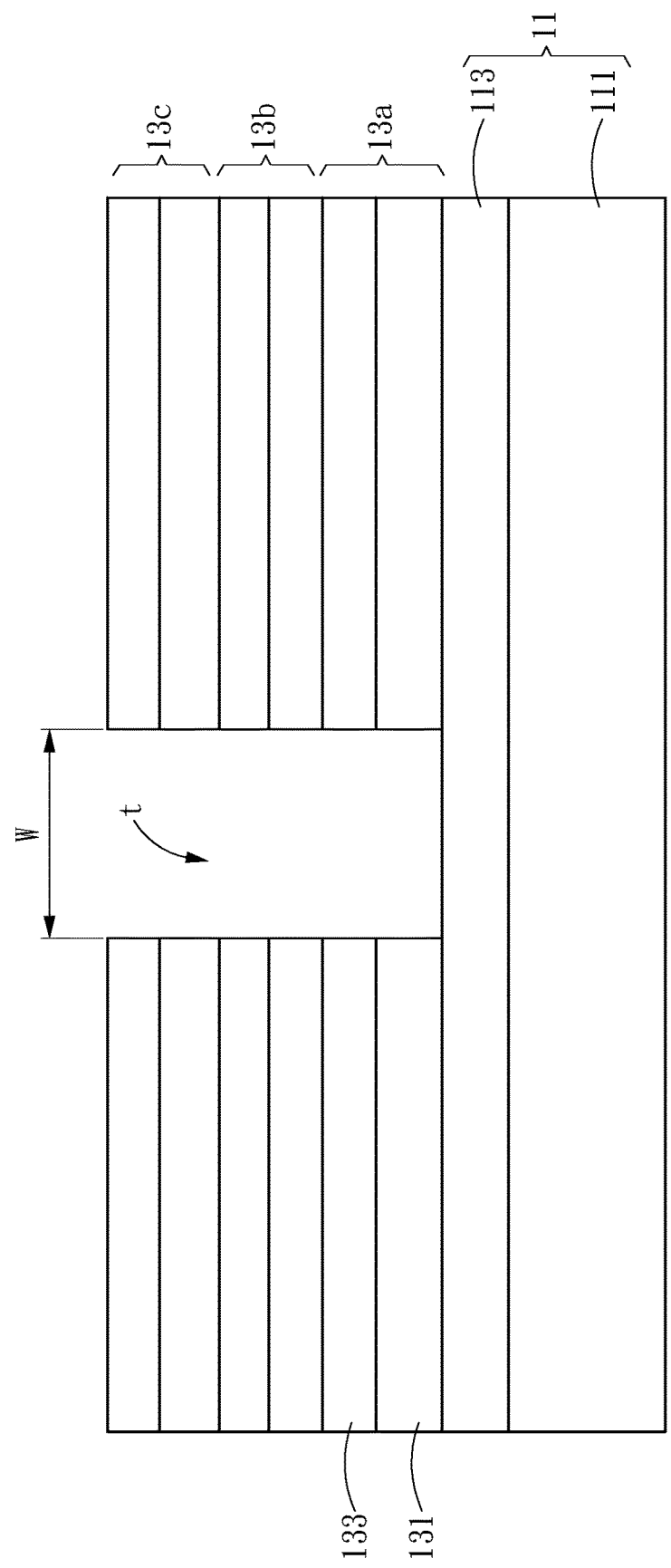
Figure 5:
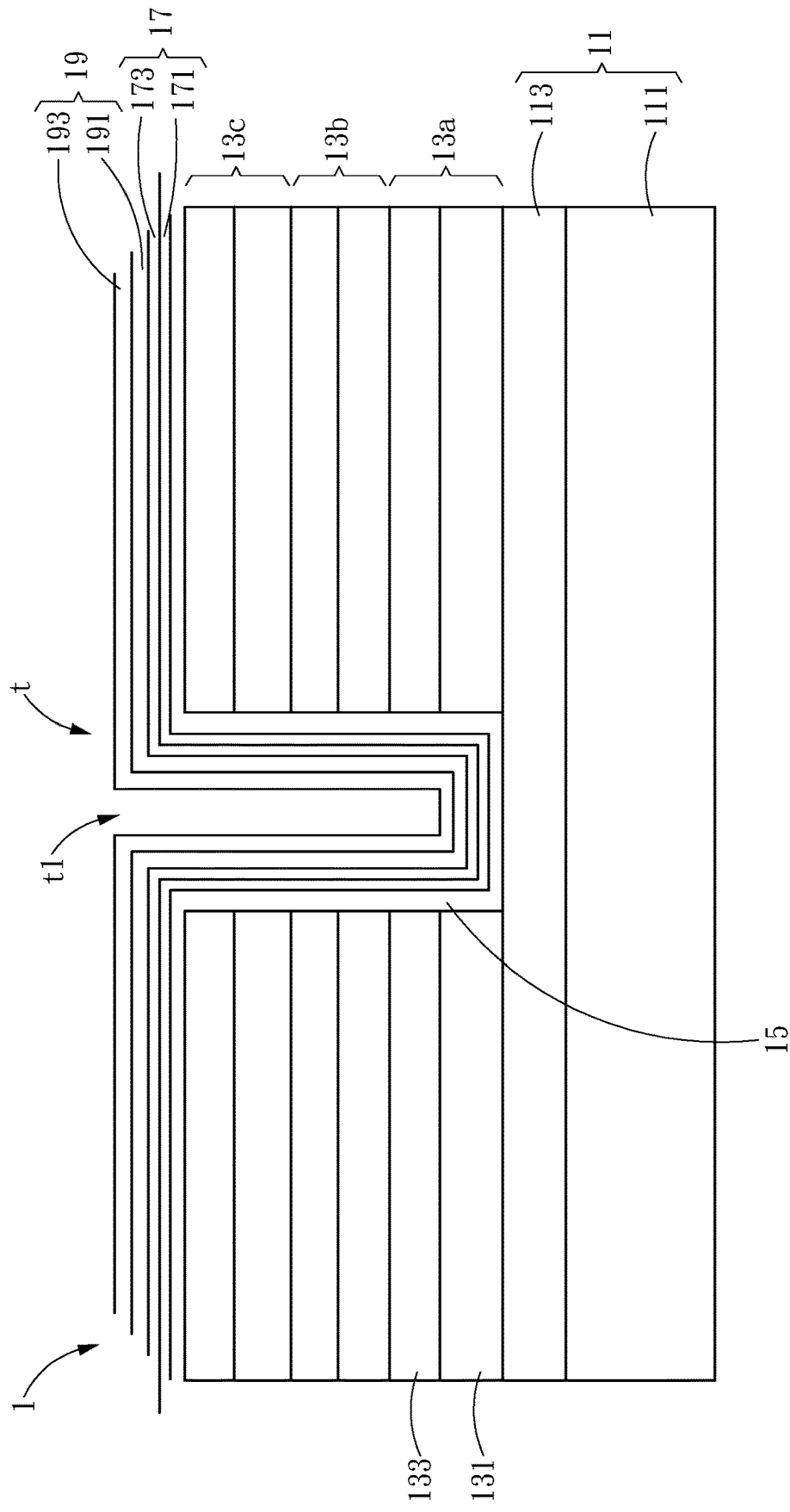
FIG. 5 is a schematic diagram of a semiconductor device according to an embodiment.

With reference to FIG. 1, FIG. 2, FIG. 3, FIG. 4, and FIG. 5, FIG. 1, FIG. 2, FIG. 3, and FIG. 4 are cross-sectional views of intermediate stages in a method for fabricating a plasma-enhanced atomic layer deposition apparatus according to some embodiments. FIG. 5 is a schematic diagram of a semiconductor device 1 according to an embodiment of the present disclosure.

Figure 1:
FIG. 1, FIG. 2, FIG. 3, and FIG. 4 are cross-sectional views illustrating intermediate stages of a process of a method for fabricating a plasma-enhanced atomic layer deposition apparatus, according to some embodiments.

Referring to FIG. 1, a substrate 11 comprising a silicon substrate 111 and a first oxide layer 113 on the silicon substrate 111 is provided in step S101.

Figure 2:
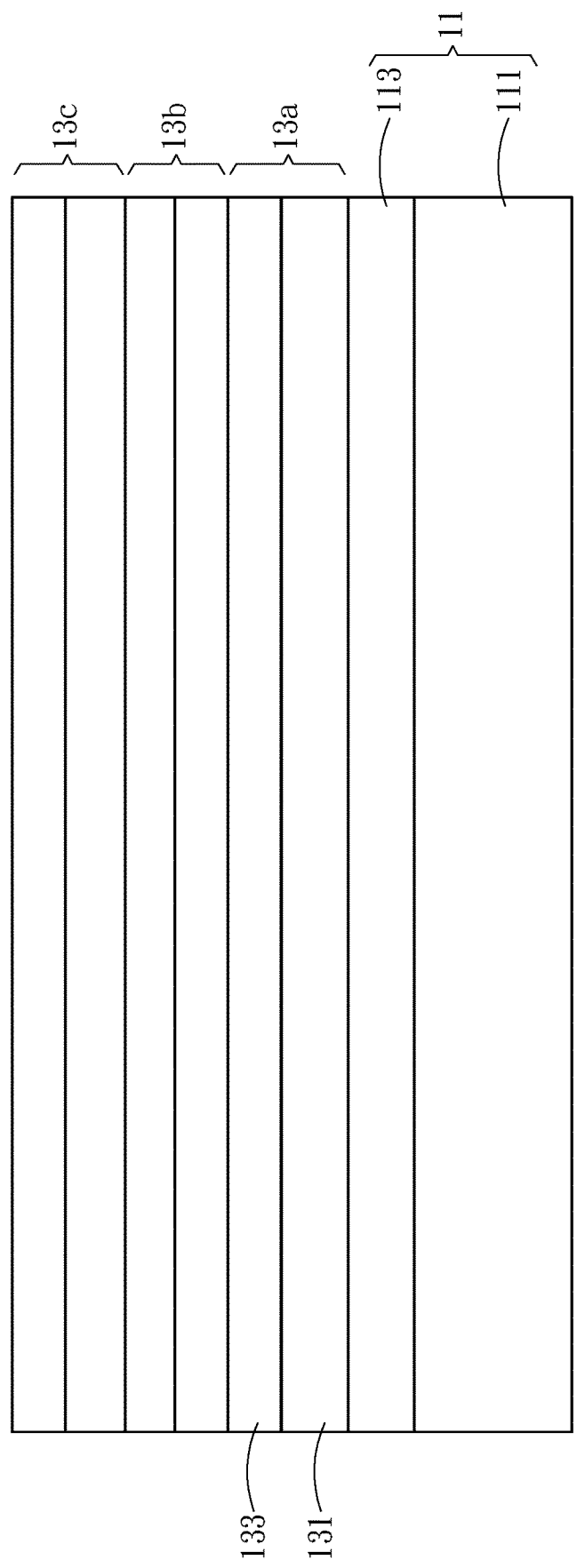

Referring to FIG. 2, in step S103, a plurality of stacked structures 13a, 13b, 13c are deposited on the substrate 11. Each of the stacked structures 13a, 13b, 13c comprises a dielectric layer and a conductive layer. FIG. 2 illustrates that the deposition of three stacked structures 13a, 13b, 13c, and one of the stacked structure 13a in which comprises a dielectric layer 133 and a conductive layer 131, but the number of stacked structures in the present disclosure is not limited thereto. In the present embodiment, the dielectric layer 133 is arranged above the conductive layer 131 in one of the stacked structures 13a, 13b, 13c, but the present disclosure is not limited thereto. In other embodiments of the present disclosure, the conductive layer 131 is arranged above the dielectric layer 133 in one of the stacked structures 13a, 13b, 13c.

In one embodiment of the present disclosure, a number of stacked structures 13a, 13b, 13c of the semiconductor device is greater than twenty. In each of the stacked structures 13a, 13b, 13c, the dielectric layer 133 is arranged above the conductive layer 131. Alternatively, the conductive layer 131 is arranged above the dielectric layer 133.

Referring to FIG. 3, the stacked structures 13a, 13b, 13c are etched through a patterned photoresist layer PR to perform an etching process E in step S105. Referring to FIG. 4, also in step S105, at least one trench t is formed in the stacked structures 13a, 13b, 13c during the etching process E, wherein the first oxide layer 113 is exposed at a bottom of the at least one trench t. For convenience of explanation, FIG. 4 takes only one such trench t for an example, but the number of trenches in the present disclosure is not limited thereto.

Figure 6:
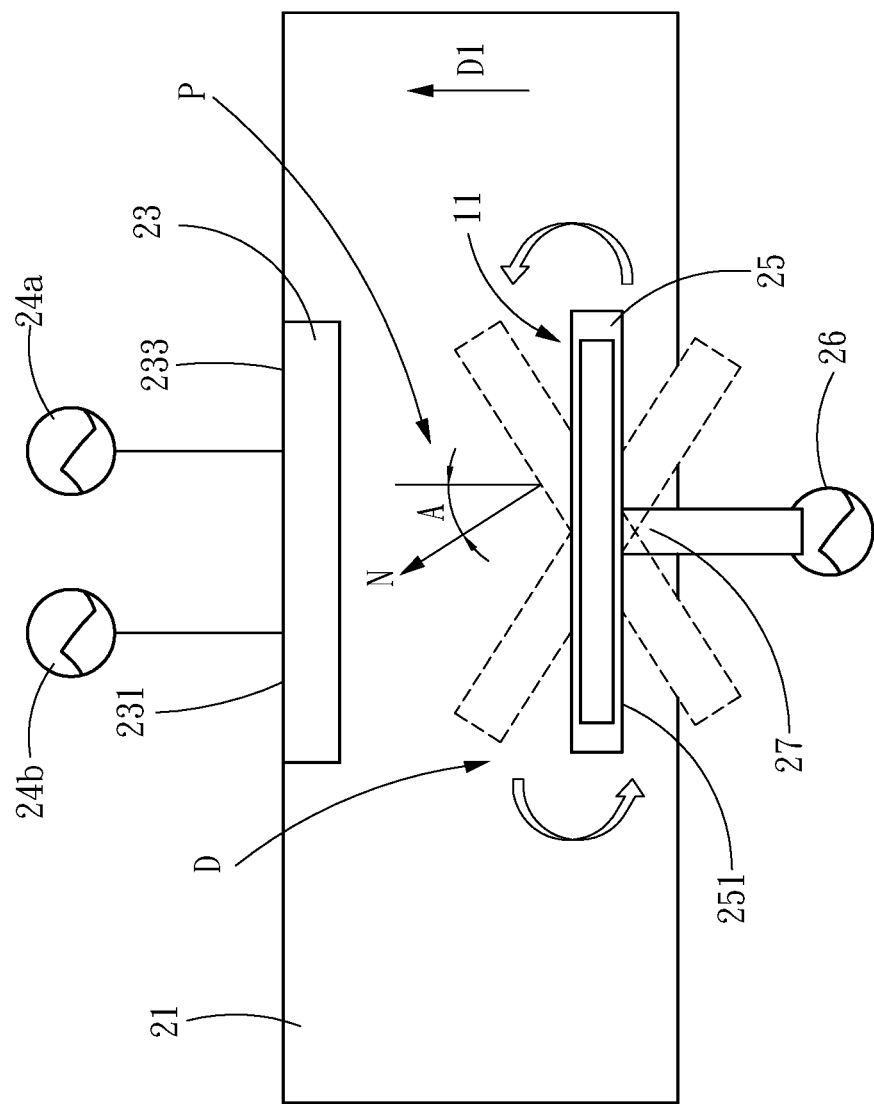
FIG. 6 is a schematic diagram of a plasma-enhanced atomic layer deposition apparatus according to an embodiment.

Referring to FIG. 6, it is a schematic diagram of a plasma-enhanced atomic layer deposition (PEALD) apparatus 20 according to one embodiment of the present disclosure. The plasma-enhanced atomic layer deposition apparatus 20 includes a chamber 21, an upper electrode 23, a lower electrode 25, and a three-dimensional rotation device 27. The upper electrode 23 is arranged at a top of the chamber 21 and is connected to a first radio-frequency power device 24. The upper electrode 23 is provided to generate a plasma P. The three-dimensional rotation device 27 is arranged at a bottom of the chamber 21. The lower electrode 25 is arranged on the three-dimensional rotation device 27 and is connected to a second radio-frequency power device 26. In the present embodiment, the substrate 11 is placed on the lower electrode 25 to perform a deposition process D. The substrate 11 shown in FIG. 6 is only for illustration but the disclosure is not limited thereto.

In step S107, referring to FIG. 5, a second oxide layer 15 is deposited on the plurality of stacked structures 13a, 13b, 13c and the at least one trench t by the plasma-enhanced atomic layer deposition apparatus 20 shown in FIG. 6. In step S109, a high resistance layer 17 is deposited on the second oxide layer 15 by the plasma-enhanced atomic layer deposition apparatus 20 shown in FIG. 6.

Next, in step S111, a low resistance layer 19 is deposited on the high resistance layer 17 by the plasma-enhanced atomic layer deposition apparatus 20 shown in FIG. 6. Through the three-dimensional rotation device 27, the plasma-enhanced atomic layer deposition apparatus 20 can greatly improve the uniformity of the deposited film.

In this embodiment, the arrangement of the lower electrode 25 and the upper electrode 23 facilitates the deposited film formed in a deep trench. Thereby, the uniformity of the deposited film can be greatly improved.

In one embodiment of the present disclosure, the high resistance layer 17 includes a first polysilicon layer 171 and a first conductive compound layer 173, but the present disclosure is not limited thereto. In one embodiment of the present disclosure, the first conductive compound layer 173 is arranged above the first polysilicon layer 171.

In one embodiment of the present disclosure, the low resistance layer 19 includes a second polysilicon layer 191 and a second conductive compound layer 193, although the present disclosure is not limited thereto. In one embodiment of the present disclosure, the second conductive compound layer 193 is arranged above the second polysilicon layer 191.

In one embodiment of the present disclosure, the second polysilicon layer 191 has a thickness greater than the first polysilicon layer 171 and the second conductive compound layer 193 has a thickness greater than the first conductive compound layer 173, although the present disclosure is not limited thereto.

As shown in FIG. 6, in detail, a direction from the lower electrode 25 to the upper electrode 23 of the plasma enhanced atomic layer deposition apparatus 20 is a first direction D1. If the three-dimensional rotation device 27 does not rotate, a normal direction N of the substrate 11 is parallel to the first direction D1. If the three-dimensional rotation device 27 drives the substrate 11 to rotate, the normal direction of the substrate 11 forms an angle A with the first direction D1. In the present embodiment, the angle A is between 0 degree and 15 degrees. As a result, the plasma-enhanced atomic layer deposition apparatus 20 can substantially improve the uniformity of the deposited film.

The deeper the at least one trench t is, the more difficult it is to be deposited. That is, it is difficult for the plasma P generated by the upper electrode 23 to perform a deposition process for a region on a sidewall of a deep trench t. Through the three-dimensional rotation device 27, the substrate 11 is rotated during the deposition processes, so that the region on the sidewall at the deep trench t can be more uniformly deposited. Thereby, the uniformity of the deposited film can be greatly improved.

In one embodiment of the present disclosure, the upper electrode 23 of the plasma enhanced atomic layer deposition apparatus 20 is connected to an upper heater 231. In each of the deposition processes D described above, the upper heater 231 heats the upper electrode 23 to facilitate uniformly deposition. As a result, the plasma-enhanced atomic layer deposition apparatus 20 can substantially improve the uniformity of the deposited film.

In one embodiment of the present disclosure, the lower electrode 25 of the plasma enhanced atomic layer deposition apparatus 20 is connected to a lower heater 251. In each of the deposition processes D described above, the lower heater 251 heats the lower electrode 25 to facilitate uniformly deposition. As a result, the plasma-enhanced atomic layer deposition apparatus 20 can substantially improve the uniformity of the deposited film.

In this embodiment, the second polysilicon layer 191 has a thickness greater than the first polysilicon layer 171 and the second conductive compound layer 193 has a thickness greater than the first conductive compound layer 173. Specifically, a resistance of the high resistance layer 17 is higher than that of the low resistance layer 19. By the arrangement of the stacked structures 13a, 13b, and 13c, the second oxide layer 15, the high resistance layer 17, and the low resistance layer 19, the quality and stability of the semiconductor device 1 can be greatly improved.

In one embodiment of the present disclosure, the thickness of the second conductive compound layer 193 is between 20 nm and 50 nm.

As shown in FIG. 5, after the low resistance layer 19 is deposited in step S111, a trench t1 still exists in the trench t, but the present disclosure is not limited thereto. In other embodiments of the present disclosure, after depositing the low resistance layer 19, the low resistance layer 19 may fill in the at least one trench t, i.e. there is no trench t1 as shown in FIG. 5.

In one embodiment of the present disclosure, the conductive layer of the plurality of stacked structures 13a, 13b, 13c is a P-type semiconductor layer or an N-type semiconductor layer and the dielectric layer is an oxide layer. For example, the conductive layer 131 of one of the plurality of the stacked structures 13a is a P-type semiconductor layer or an N-type semiconductor layer, and the dielectric layer 133 is an oxide layer.

In one embodiment of the present disclosure, a material of the first conductive compound layer 173 and/or the second conductive compound layer 193 may be BN, BP, BAs, AN, AlP, AlAs, GaN, GaP, GaAs, InN, InP, InAs or a combination of at least two of the above-mentioned.

In one embodiment of the present disclosure, a conductivity of the high resistance layer 17 is about 1e15 S·m$^{-1}$ and a conductivity of the low resistance layer 19 is about 1e20 S·m$^{-1}$. The thickness of the high resistance layer 17 is about 20 nm, and the thickness of the low-resistance layer 19 is about 30 nm.

As shown in FIG. 4, in one embodiment of the present disclosure, a width w of the at least one trench t is between 45 nm and 65 nm. A thickness of the silicon substrate 111 is between 520 nm and 580 nm, and a thickness of the first oxide layer 113 is between 90 nm and 110 nm. In the stacked structures 13a, 13b, 13c (exemplified by the stacked structures 13a), a thickness of the dielectric layer 133 is between 18 nm and 22 nm, and a thickness of the conductive layer 131 is between 27 nm and 33 nm.

Figure 7:
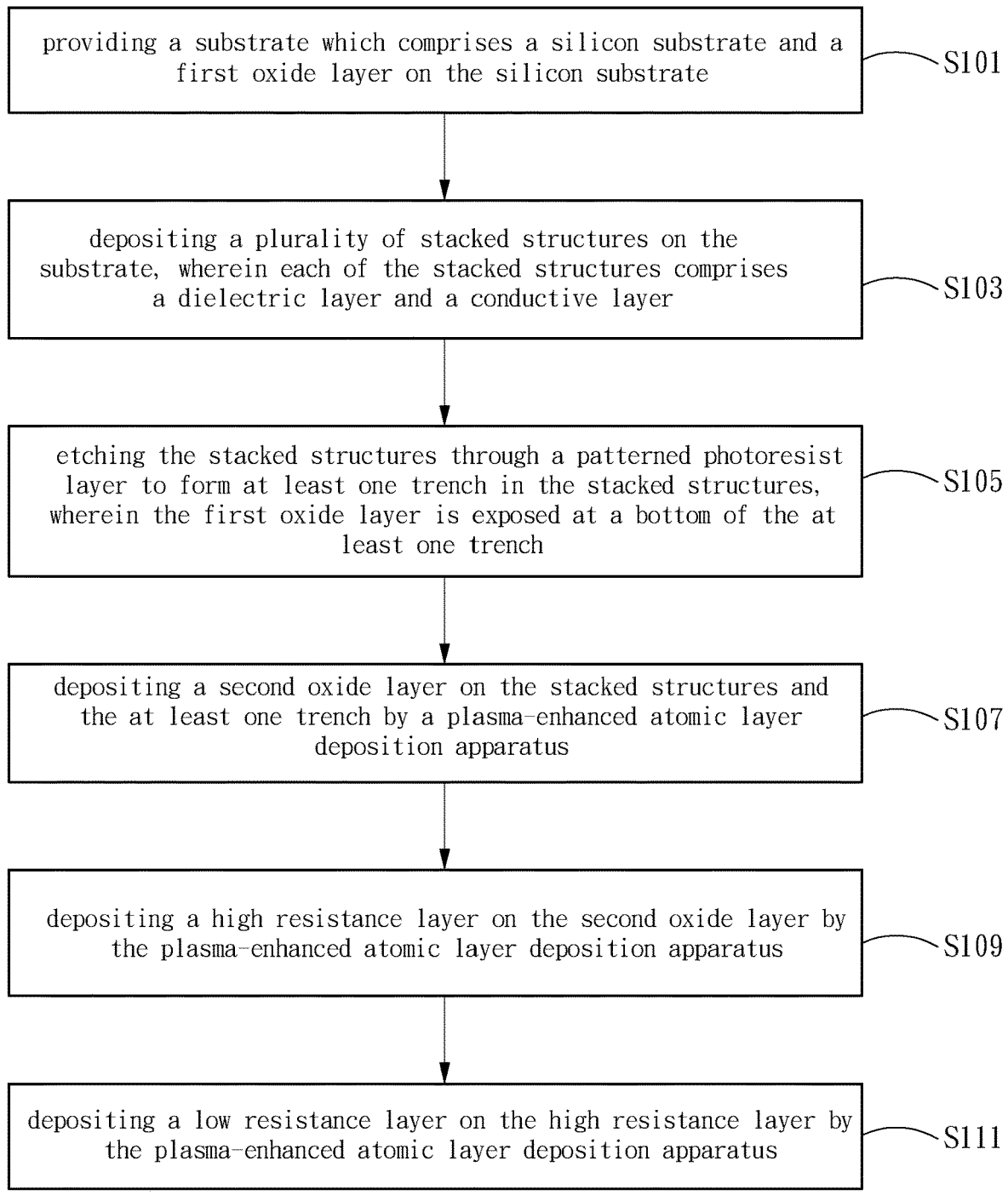
FIG. 7 is a flowchart of a method for manufacturing a plasma enhanced atomic layer deposition apparatus according to an embodiment.

FIG. 7 shows a flowchart illustrating a method for manufacturing the plasma enhanced atomic layer deposition device 20 according to an embodiment of the present disclosure. Specifically, FIG. 7 is a flowchart of a manufacturing method 100 of the semiconductor device 1 shown in FIG. 5. Multiple implementation details of the steps S101, S103, S105, S107, S109, and S111 included in the manufacturing method 100 are described in detail in the foregoing embodiments and implementations, and will not be described in detail below.

In view of the foregoing, the plasma-enhanced atomic layer deposition apparatus and the manufacturing method thereof according to the embodiments of the present disclosure can significantly improve the quality and stability of a semiconductor device by providing a plurality of stacked structures, a second oxide layer, a high resistance layer, and a low resistance layer. Through the three-dimensional rotation device, the plasma-enhanced atomic layer deposition apparatus can greatly improve the uniformity of the deposited film.

What is claimed is:

1. A method for fabricating a semiconductor device using a plasma-enhanced atomic layer deposition, comprising:
    providing a substrate which comprises a silicon substrate and a first oxide layer on the silicon substrate;
    depositing a plurality of stacked structures on the substrate, wherein a number of the plurality of stacked structures is greater than twenty, and each of the plurality of stacked structures comprises a dielectric layer and a conductive layer arranged above or below the dielectric layer;
    etching the plurality of stacked structures through a patterned photoresist layer to form at least one trench in the plurality of stacked structures, wherein the first oxide layer is exposed at a bottom of the at least one trench;
    depositing a second oxide layer on the stacked structures and the at least one trench by a plasma-enhanced atomic layer deposition apparatus, wherein the plasma-enhanced atomic layer deposition apparatus comprises a chamber, an upper electrode, a lower electrode, and a three-dimensional rotation device, the upper electrode is arranged at a top of the chamber and connected to a first radio-frequency power device to generate a plasma, the lower electrode is arranged on the three-dimensional rotation device and connected to a second radio-frequency power device, and the three-dimensional rotation device is arranged at a bottom of the chamber, and wherein the substrate is provided on the lower electrode, and the substrate is rotated by the three-dimensional rotation device to uniformly deposit the second oxide layer during a deposition process;
    depositing a high resistance layer on the second oxide layer by the plasma-enhanced atomic layer deposition apparatus, wherein the high resistance layer comprises a first polysilicon layer and a first conductive compound layer; and
    depositing a low resistance layer on the high resistance layer by the plasma-enhanced atomic layer deposition apparatus, wherein the low resistance layer comprises a second polysilicon layer and a second conductive compound layer, the second polysilicon layer has a thickness greater than the first polysilicon layer, and the second conductive compound layer has a thickness greater than the first conductive compound layer.

2. The method of claim 1, wherein a direction from the lower electrode to the upper electrode is a first direction, if the three-dimensional rotation device does not rotate, a normal direction of the substrate is parallel to the first direction, and if the three-dimensional rotation device drives the substrate to rotate, the normal direction of the substrate has an angle with the first direction, the angle is between 0 degree and 15 degrees.

3. The method of claim 1, wherein the upper electrode is connected to an upper heater that heats the upper electrode during the deposition process to achieve uniform deposition.

4. The method of claim 1, wherein the lower electrode is connected to a lower heater that heats the lower electrode during the deposition process to achieve uniform deposition.

5. The method of claim 1, wherein a width of the at least one trench is between 45 nm and 65 nm.

6. The method of claim 1, wherein a thickness of the silicon substrate is between 520 nm and 580 nm, a thickness of the first oxide layer is between 90 nm and 110 nm, a thickness of the dielectric layer is between 18 nm and 22 nm, and a thickness of the conductive layer is between 27 nm and 33 nm.

7. A method for fabricating a semiconductor device using a plasma-enhanced atomic layer deposition, comprising:
 providing a substrate comprising a silicon substrate and a first oxide layer on the silicon substrate;
 depositing a plurality of stacked structures on the substrate, wherein each of the stacked structures comprises a dielectric layer and a conductive layer, the conductive layer is a P-type semiconductor layer or an N-type semiconductor layer, and the dielectric layer is an oxide layer;
 etching the stacked structures through a patterned photoresist layer to form at least one trench in the stacked structures, wherein the first oxide layer is exposed at a bottom of the at least one trench;
 depositing a second oxide layer on the stacked structures and the at least one trench by a plasma-enhanced atomic layer deposition apparatus, wherein the plasma-enhanced atomic layer deposition apparatus comprises a chamber, an upper electrode, a lower electrode, and a three-dimensional rotation device, the upper electrode is arranged at a top of the chamber and connected to a first radio-frequency power device to generate a plasma, the lower electrode is arranged on the three-dimensional rotation device and connected to a second radio-frequency power device, and the three-dimensional rotation device is arranged at a bottom of the chamber, and wherein the substrate is provided on the lower electrode, and the substrate is rotated by the three-dimensional rotation device to uniformly deposit the second oxide layer during a deposition process;
 depositing a high resistance layer on the second oxide layer by the plasma-enhanced atomic layer deposition apparatus, wherein the high resistance layer comprises a first polysilicon layer and a first conductive compound layer; and
 depositing a low resistance layer on the high resistance layer by the plasma-enhanced atomic layer deposition apparatus, wherein the low resistance layer comprises a second polysilicon layer and a second conductive compound layer, the second polysilicon layer has a thickness greater than the first polysilicon layer, and the second conductive compound layer has a thickness greater than the first conductive compound layer.

8. The method of claim 7, wherein a direction from the lower electrode to the upper electrode is a first direction, if the three-dimensional rotation device does not rotate, a normal direction of the substrate is parallel to the first direction, and if the three-dimensional rotation device drives the substrate to rotate, the normal direction of the substrate has an angle with the first direction, the angle is between 0 degree and 15 degrees.

9. The method of claim 7, wherein the upper electrode is connected to an upper heater that heats the upper electrode during the deposition process to achieve uniform deposition.

10. The method of claim 7, wherein the lower electrode is connected to a lower heater that heats the lower electrode during the deposition process to achieve uniform deposition.

11. The method of claim 7, wherein a width of the at least one trench is between 45 nm and 65 nm.

12. The method of claim 7, wherein a thickness of the silicon substrate is between 520 nm and 580 nm, a thickness of the first oxide layer is between 90 nm and 110 nm, a thickness of the dielectric layer is between 18 nm and 22 nm, and a thickness of the conductive layer is between 27 nm and 33 nm.

* * * * *